(12) United States Patent
Satou (10) Patent No.: US 7,906,897 B2
(45) Date of Patent: Mar. 15, 2011

(54) ORGANIC ELECTROLUMINESCENT ELEMENT AND DEVICE

(75) Inventor: Tasuku Satou, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 666 days.

(21) Appl. No.: 11/896,434

(22) Filed: Aug. 31, 2007

(65) Prior Publication Data

US 2008/0054799 A1      Mar. 6, 2008

(30) Foreign Application Priority Data

Sep. 6, 2006 (JP) ................. 2006-242080
Sep. 6, 2006 (JP) ................. 2006-242081
May 17, 2007 (JP) ................. 2007-131640

(51) Int. Cl.
*H01J 33/04* (2006.01)
(52) U.S. Cl. ...................... 313/504; 313/506
(58) Field of Classification Search .......... 313/498–512; 428/690
See application file for complete search history.

(56) References Cited

U.S. PATENT DOCUMENTS 5,281,489 A * 1/1994 Mori et al. ............... 428/690
6,869,695 B2 * 3/2005 Thompson et al. ....... 428/690

FOREIGN PATENT DOCUMENTS

| JP | 2004-522276 A | | 7/2004 |
| JP | 2005-38763 A | | 2/2005 |
| JP | 2005038763 A | * | 2/2005 |

* cited by examiner

Primary Examiner — Anne M Hines
(74) Attorney, Agent, or Firm — Birch, Stewart, Kolasch & Birch, LLP (57) ABSTRACT

An organic electroluminescent (EL) element includes at least a positive hole transport layer, a light emitting layer and an electron transport layer between at least a pair of electrodes, wherein the light emitting layer contains therein at least two light emitting materials having different Ea values or Ip values and emitting phosphorescence having the same color as each other, and among the two light emitting materials, a light emitting material having a larger Ea value or Ip value is contained at a higher density in a region of the light emitting layer in the vicinity of the positive hole transport layer, while a light emitting material having a smaller Ea value or Ip value is contained at a higher density in a region of the light emitting layer in the vicinity of the electron transport layer.

17 Claims, 1 Drawing Sheet

Figure 1

ORGANIC ELECTROLUMINESCENT ELEMENT AND DEVICE

CROSS REFERENCE TO RELATED APPLICATION

This application claims priority under 35 USC 119 from Japanese Patent Application Nos. 2006-242,080, 2006-242,081 and 2007-131,640, the disclosures of which are incorporated by reference herein.

BACKGROUND OF THE PRESENT INVENTION

1. Field of the Present Invention

The present invention relates to an organic electroluminescent element and a display device using the same which can be effectively applied to a surface light source for full color display, backlight, illumination light sources and the like; or a light source array for printers, and the like.

2. Description of the Related Art

An organic electroluminescence element (hereinafter, referred to as an "organic EL element" in some cases) is composed of a light emitting layer or a plurality of organic layers containing a light emitting layer, and a pair of electrodes sandwiching the organic layers. The organic EL element is an element for obtaining luminescence by utilizing at least either one of luminescence from excitons each of which is obtained by recombining an electron injected from a cathode with a positive hole injected from an anode to produce exciton, or luminescence from exciton of other molecules produced by energy transmission from the above-described excitons.

Heretofore, an organic EL element has been developed by using a laminate structure from integrated layers in which each layer is functionally differentiated, whereby brightness and device efficiency are remarkably improved. For example, it is described in "Science", vol. 267, No. 3, page 1332; 1995 that a two-layer laminated type device obtained by laminating a positive hole-transport layer and a light emitting layer also functioning as an electron-transport layer; a three-layer laminated type device obtained by laminating a positive hole-transport layer, a light emitting layer, and an electron-transport layer; and a four-layer laminated type device obtained by laminating a positive hole-transport layer, a light emitting layer, a positive hole-blocking layer, and an electron-transport layer have been frequently disclosed.

Conventionally, layers disposed between a light emitting layer and electrodes are generally designed to lower an energy barrier at the interface therebetween for the purpose of allowing positive holes and electrons to smoothly move from an anode and a cathode, respectively. For example, light emitting materials having a relatively low Ip value (ionization potential) are preferably used for a light emitting layer to lower the barrier against positive holes supplied by an anode at an interface between a positive hole transport layer and the light emitting layer. Further, light emitting materials having a relatively high Ea value (electron affinity) are preferably used for a light emitting layer to lower the barrier against electrons supplied by a cathode at an interface between an electron transport layer and the light emitting layer. Such designs have been helpful in reducing driving voltages and improving luminescent efficiency to a certain degree. However, large improvement in luminescent efficiency could not be expected by those means.

Japanese Patent Application Laid-Open (JP-A) No. 2005-38763 discloses that, by a configuration in which a plurality of light emitting layers each containing the same light emitting materials or fluorescent light emitting materials having similar color is laminated in series, element durability is improved. However, large improvement in luminescent efficiency could not be expected.

On the other hand, it is known that theoretical luminescent efficiency is increased by about four times by using a phosphorescence-irradiating material as a light emitting material for an organic electroluminescent element. For example, Japanese National Publication No. 2004-522276 discloses a white luminescent element using a phosphorescence light emitting material. In particular, an organic electroluminescent (EL) element using the phosphorescence light emitting material is attracting attention as a promising luminescent element for a passive matrix organic EL display by making use of a residual image effect. However, it has been revealed that the organic EL element using the phosphorescence light emitting material may cause a specific phenomenon referred to as "Roll-off" in which a radical deterioration of luminescent efficiency occurs in a high current density region of emission. Analysis of the causes and research for means of improving the trouble have been tried from various approaches. However, effective means have not yet been discovered. Therefore, it is desired to further develop improvement means for the organic EL element.

SUMMARY OF THE INVENTION

The present invention has been made in view of the above circumstances and provides an organic electroluminescent element comprising at least a positive hole transport layer, a light emitting layer and an electron transport layer between at least a pair of electrodes, wherein the light emitting layer contains therein at least two light emitting materials having different electron affinity (abbreviated to Ea values) or ionization potentials (abbreviated to Ip values) and emitting phosphorescence having the same color as each other, and among the two light emitting materials, a light emitting material having a larger Ea value or Ip value is contained at a higher density in a region of the light emitting layer in the vicinity of the positive hole transport layer, while a light emitting material having a smaller Ea value or Ip value is contained at a higher density in a region of the light emitting layer in the vicinity of the electron transport layer.

Another aspect of the present invention is to provide a passive-matrix drive display device using the organic electroluminescent element according to the first aspect.

DETAILED DESCRIPTION OF THE INVENTION

An object of the present invention is to provide an organic electroluminescent element in which luminescent efficiency is improved in a high luminance region, and to provide a display device using the same.

The present invention provides an organic electroluminescent (EL) element comprising at least a positive hole transport layer, a light emitting layer and an electron transport layer that are interposed between at least a pair of electrodes, wherein the light emitting layer contains therein at least two light emitting materials having different electron affinity (abbreviated to Ea values) or ionization potentials (abbreviated to Ip values) and emitting phosphorescence having the same color as each other, and among the two light emitting materials, a light emitting material having a larger Ea value or Ip value is contained at a higher density in a region of the light emitting layer in the vicinity of the positive hole transport layer, while a light emitting material having a smaller Ea value or Ip value is contained at a higher density in a region of the light emitting layer in the vicinity of the electron transport layer.

One aspect of the present invention is to provide an organic electroluminescent (EL) element comprising at least a positive hole transport layer, a light emitting layer and an electron transport layer between at least a pair of electrodes, wherein the light emitting layer contains therein at least two light emitting materials emitting phosphorescence having the same color, and among the two light emitting materials, a light emitting material having a larger Ea value is contained at a higher density in a region of the light emitting layer in the vicinity of the positive hole transport layer, while a light emitting material having a smaller Ea value is contained at a higher density in a region of the light emitting layer in the vicinity of the electron transport layer.

The difference between Ea values of the two light emitting materials is preferably in a range of 0.1 to 0.5 eV, and more preferably in a range of 0.2 to 0.4 eV.

If the difference between the Ea values of the two light emitting materials is smaller than the aforementioned ranges, the difference between electron trapping properties is excessively small thus making it difficult to capture electrons which leak at a high current density, and if the difference between the Ea values is larger than the aforementioned ranges, luminescent efficiency at a low current density is noticeably decreased, which is not preferable.

A second aspect of the present invention is provide an organic electroluminescent element comprising at least a positive hole transport layer, a light emitting layer and an electron transport layer between at least a pair of electrodes, wherein the light emitting layer contains therein at least two light emitting materials emitting phosphorescence having the same color, and among the two light emitting materials, a light emitting material having a smaller Ip value is contained at a higher density in a region of the light emitting layer in the vicinity of the electron transport layer, while a light emitting material having a larger Ip value is contained at a higher density in a region of the light emitting layer in the vicinity of the positive hole transport layer.

Preferably, the difference between the Ip values of the two light emitting materials is in a range of 0.1 to 0.5 eV, and more preferably in a range of 0.2 to 0.4 eV.

If the difference between the Ip values of the two light emitting materials is smaller than the aforementioned ranges, the difference between positive hole-trapping properties is excessively small thus making it difficult to capture positive holes which leak at a high current density, and if the difference between the Ip values is larger than the aforementioned ranges, luminescent efficiency at a low current density is noticeably decreased, which is not preferable.

A third aspect of the present invention is to provide an organic electroluminescent element comprising at least a positive hole transport layer, a light emitting layer and an electron transport layer that are interposed between at least a pair of electrodes, wherein the light emitting layer contains therein at least two light emitting materials emitting phosphorescence having the same color, and among the two light emitting materials, a light emitting material having larger Ea and Ip values is contained at a higher density in a region of the light emitting layer in the vicinity of the positive hole transport layer, while a light emitting material having smaller Ea and Ip values is contained at a higher density in a region of the light emitting layer in the vicinity of the electron transport layer.

Preferably, the difference between the Ea values of the two light emitting materials is in a range of 0.1 to 0.5 eV and that between the Ip values is in a range of 0.1 to 0.5 eV, and more preferably, the difference between the Ea values of the two light emitting materials is in a range of 0.2 to 0.4 eV, and that between the Ip values is in a range of 0.2 to 0.4 eV.

If the differences between the Ea values and the Ip values of the two light emitting materials are smaller than the aforementioned ranges, the differences between charge-trapping properties are excessively small thus making it difficult to capture both of the charges which leak at a high current density, and if the differences between the EP values and the Ip values are larger than the aforementioned ranges, luminescent efficiency at a low current density is noticeably decreased, which is not preferable.

In the first to third aspects of the present invention described above, the description that a light emitting material is contained at a higher density in the region of the light emitting layer in the vicinity of the positive hole transport layer or in the region of the light emitting layer in the vicinity of the electron transport layer means that the content of the light emitting material is 100% by weight, or, in a case where it coexists with another light emitting material, is 55% by weight or more, and preferably 80% by weight or more, with respect to the total amount of light emitting materials.

According to the present invention, an organic electroluminescent element and a display device that are improved in luminescent efficiency at high brightness light emission are provided. In particular, in a passive matrix drive organic electroluminescent element and a display device using the same, "roll-off" occurring at a high current density is suppressed, and light-emission with high luminance and high efficiency is realized.

Preferably, the difference between peak wavelengths of light emission of the two light emitting materials is 30 nm or less, and more preferably 20 nm or less.

Preferably, the light emitting material contained at a higher density in a region of the light emitting layer in the vicinity of the positive hole transport layer is a platinum compound, and the light emitting material contained at a higher density in a region of the light emitting layer in the vicinity of the electron transport layer is an iridium compound.

Preferably, the light emitting layer comprises at least two layers, and a first light emitting layer in the vicinity of the positive hole transport layer contains the platinum compound, and a second light emitting layer in the vicinity of the electron transport layer contains the iridium compound.

Preferably, the platinum compound is a phosphorescence luminescent organic metal complex containing platinum as a central metal, and the iridium compound is a phosphorescence luminescent organic metal complex containing iridium as a central metal. More preferably, the platinum compound is a phosphorescence luminescent organic metal complex containing a tridentate ligand or a higher polydenate ligand, and the iridium compound is a phosphorescence luminescent organic metal complex containing a bidentate ligand or a higher polydenate ligand.

In the present invention, the light emitting layer may contain therein a mixture of a platinum compound and an iridium compound. However, the content of the platinum compound is larger in the region of the light emitting layer in the vicinity of the positive hole transport layer, while the content of the iridium compound is larger in the region of the light emitting layer in the vicinity of the electron transport layer. The description in the present invention that "the content of the light emitting material is larger" means that, within all of the light emitting materials in the corresponding region of the light emitting layer, one single light emitting material is contained in the corresponding region of the light emitting layer, or means that if the light emitting material is used in combination with another light emitting material, the content of the light emitting material in the corresponding region of the light emitting layer is 55% by weight or more, and preferably 80% by weight or more, with respect to the total amount of light emitting materials contained in the corresponding region of the light emitting layer. For example, in the region of the light emitting layer in the vicinity of the positive hole transport layer, the platinum compound alone may be contained as the light emitting material. However, when the platinum compound is used in combination with the iridium compound in the region of the light emitting layer in the vicinity og the positive hole transport layer, the content of the platinum compound is 55% by weight or more, and preferably 80% by weight or more, with respect to the total amount of the light emitting materials.

In the present invention, density distributions of the platinum compound and the iridium compound in a thickness direction of the light emitting layer may be changed either in a continuous pattern or a step-wise pattern. One preferable pattern is such that the light emitting layer comprises at least two light emitting layers, and the first light emitting layer in the vicinity of the positive hole transport layer contains the platinum compound, and the second light emitting layer in the vicinity of the electron transport layer contains the iridium compound.

Preferably, the platinum compound is a phosphorescence luminescent organic metal complex having platinum as a central metal, and the iridium compound is a phosphorescence luminescent organic metal complex having iridium as a central metal.

One of the aspects of the display device of the present invention is a display device for emitting single color luminescence with high luminance at a high current density. Another aspect of the present invention is a display device in which white luminescence with high luminance can be emitted by using the platinum compound and the iridium compound whose luminescent colors are different from each other.

In particular, when the display device is driven at a high current density of 10 mA/cm$^2$ or more, the display device using the organic electroluminescent element of the present invention can realize the luminescence with high efficiency and with high luminance.

Particularly, when the passive matrix drive display is used as the display device, "roll-off" at a the high current density can be suppressed, and luminescence with high efficiency and with high luminance is realized.

In the following, the organic electroluminescence element of the present invention will be described in detail.

1. Organic EL Element

The organic electroluminescence element according to the present invention has at least one organic compound layer including a light emitting layer in between a pair of electrodes (anode and cathode), and further preferably has a positive hole-injection layer between the anode and the light emitting layer as well as an electron-transport layer between the cathode and the light emitting layer.

1) Layer Configuration

<Electrode>

At least one of a pair of electrodes of the organic electroluminescence device of the present invention is a transparent electrode, and the other one is a rear surface electrode. The rear surface electrode may be transparent or non-transparent.

<Configuration of Organic Compound Layer>

A layer configuration of the at least one organic compound layer can be appropriately selected, without particular restriction, depending on an application of the organic electroluminescence device and an object thereof However, the organic compound layers are preferably formed on the transparent electrode or the rear surface electrode. In these cases, the organic compound layers are formed on front surfaces or one surface on the transparent electrode or the rear surface electrode.

A shape, magnitude and thickness of the organic compound layers can be appropriately selected, without particular restriction, depending on applications thereof.

Examples of specific layer configurations include those cited below, but the present invention is not restricted to those configurations.

Anode/positive hole-transport layer/light emitting layer/electron-transport layer/cathode, Anode/positive hole-transport layer/light emitting layer/blocking layer/electron-transport layer/cathode, Anode/positive hole-transport layer/light emitting layer/blocking layer/electron-transport layer/electron-injection layer/cathode, Anode/positive hole-injection layer/positive hole-transport layer/light emitting layer/blocking layer/electron-transport layer/cathode, and Anode/positive hole-injection layer/positive hole-transport layer/light emitting layer/blocking layer/electron-transport layer/electron-injection layer/cathode.

In the following, the respective layers will be described in detail.

2) Positive Hole-transport Layer

The positive hole-transport layer that is used in the present invention includes a positive hole transporting material. For the positive hole transporting material, any material can be used without particular restriction as far as it has either one of a function of transporting holes or a function of blocking to electrons injected from the cathode. As the positive hole transporting material that can be used in the present invention, either one of a low molecular weight hole transporting material and a polymer hole transporting material can be used.

Specific examples of the positive hole transporting material that can be used in the present invention include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, a polysilane-based compound, a poly(N-vinylcarbazole) derivative, an aniline-based copolymer, electric conductive polymers or oligomers such as a thiophene oligomer and polythiophene, and polymer compounds such as a polythiophene derivative, a polyphenylene derivative, a polyphenylenevinylene derivative and a polyfluorene derivative.

These compounds may be used singularly or in a combination of two or more.

A thickness of the positive hole-transport layer is preferably 10 nm to 200 nm and more preferably 20 nm to 80 nm. When the thickness exceeds 200 nm, a driving voltage increases in some cases. When it is less than 10 nm, a shortening of a circuit of the light-emitting element may be happened, which is not preferable.

3) Hole-injection Layer

In the present invention, a positive hole-injection layer may be disposed between the positive hole-transport layer and the anode.

The positive hole-injection layer is a layer that makes it easy for holes to be injected easily from the anode to the positive hole-transport layer, and specifically, a material having a small ionization potential among the positive hole transporting materials cited above is preferably used. For instance, a phthalocyanine compound, a porphyrin compound and a star-burst type triarylamine compound can be preferably used.

A film thickness of the positive hole-injection layer is preferably 1 nm to 30 nm.

An electron-accepting dopant may be introduced into a positive hole-injection layer or a positive hole-transport layer of the organic EL element in the present invention. Either of an inorganic compound or an organic compound may be used as long as the compound has electron accepting property and a function for oxidizing an organic compound. Specifically, metal halides such as ferric chloride, aluminum chloride, gallium chloride, indium chloride, antimony penta-chloride and the like, and metal oxides such as vanadium pentaoxide and molybdenum trioxide are preferably used as the inorganic compounds.

In case of the organic compounds, compounds having substituents such as a nitro group, a halogen, a cyano group, or a trifluoromethyl group; quinone compounds, acid anhydride compounds, fullerenes and the like may be preferably applied.

Another specific examples thereof include compounds described in patent documents such as JP-A Nos. 6-212153, 11-111463, 11-251067. 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

These electron-accepting dopants may be used alone or in a combination of two or more of them. Although an applied amount of these electron-accepting dopants depends on the type of material, 0.01% by weight to 50% by weight of a dopant is preferred with respect to a positive hole-transport layer material, 0.05% by weight to 20% by weight is more preferable, and 0.1% by weight to 10% by weight is particularly preferred.

4) Light Emitting Layer

A light emitting layer of the present invention comprises at least two light emitting materials having a same color each other. In one embodiment of the present invention, and among the two light emitting materials, a light emitting material having larger Ea value is contained at a higher density in a region of the light emitting layer in the vicinity of the positive hole transport layer, while a light emitting material having smaller Ea value is contained at a higher density in a region thereof in the vicinity of the electron transport layer. In second embodiment of the present invention, and among the two light emitting materials, a light emitting material having larger Ip value is contained at a higher density in a region of the light emitting layer in the vicinity of the positive hole transport layer, while a light emitting material having smaller Ip value is contained at a higher density in a region thereof in the vicinity of the electron transport layer. In third embodiment of the present invention, and among the two light emitting materials, a light emitting material having larger Ea value and Ea value is contained at a higher density in a region of the light emitting layer in the vicinity of the positive hole transport layer, while a light emitting material having smaller Ea value and Ea value is contained at a higher density in a region thereof in the vicinity of the electron transport layer.

Preferably, the light emitting material contained at a higher density in a region of the light emitting layer in the vicinity of the positive hole transport layer is a platinum compound, and the light emitting material contained at a higher density in a region of the light emitting layer in the vicinity of the electron transport layer is an iridium compound.

The light emitting layer of the present invention may be formed by a laminate of a plurality of the light emitting layers or by the compositions of the light emitting materials being continuously changed in a thickness direction thereof If the light emitting layer is formed by the laminate of the plurality of the light emitting layers, preferable examples thereof include:

anode/positive hole transport layer/light emitting layer containing therein a light emitting material having a larger Ea value at a higher density/light emitting layer containing a light emitting material having a smaller Ea value at a higher density/electron transport layer/cathode;

anode/positive hole transport layer/light emitting layer containing therein a light emitting material having a larger Ip value at a higher density/light emitting layer containing therein a light emitting material having a smaller Ip value at a higher density/electron transport layer/cathode, and anode/positive hole transport layer/light emitting layer containing therein a light emitting material having larger Ea and Ip values at a higher density/light emitting layer containing therein a light emitting material having a smaller Ea or Ip value at a higher density/electron transport layer/cathode.

More preferable examples of the layer configuration include:

anode/positive hole transport layer/light emitting layer containing therein a platinum compound at a higher density/light emitting layer containing therein an iridium compound at a higher density/electron transport layer/cathode; and anode/positive hole transport layer/light emitting layer containing therein a platinum compound at a higher density/light emitting layer containing therein both the platinum compound and the iridium compound/light emitting layer containing therein the iridium compound at a higher density/electron transport layer/cathode.

Further, a third and a fourth light emitting layers having an intermediate composition of the light emitting materials with respect to a composition of the light emitting layer may be provided between the two light emitting layers described above.

If the light emitting layer is formed by the composition of the light emitting materials being continuously changed in the thickness direction, the light emitting layer, which is formed by a vapor evaporation method, can be formed such that the respective evaporation speeds, at which a plurality of the light emitting materials is supplied from each evaporation stations, are continuously changed, and the plurality of the light emitting materials is deposited with different compositions. Alternately, if a light emitting layer is formed by a coating method, the light emitting layer is formed by coating a second coating liquid containing therein a second light emitting material with a solvent as a medium, which is used for dissolving or swelling a first coating layer, on a the first coating layer containing therein a first light emitting material, and thereby intermixing the first and the second light emitting materials between the layers.

In the present invention, the light emitting layer may comprise a positive hole transform material, an electron transport material, or a host material other than the light emitting materials, as necessary.

(Light Emitting Material)

The light emitting layer of the present invention contains therein a material that emits at least two light emitting materials emitting phosphorescence having similar color each other. Preferably, the difference between the luminescent peak wavelengths from the two light emitting materials is preferably 30 nm or less, and more preferably 20 nm or less.

Examples of the phosphorescence luminescent dopants are not limited specifically, but generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU -KISO TO OUYOU- (Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. Nos. 6,303,238 B1, 6,097,147, WO00/57676, WO00/70655, WO01/08230, WO01/39234A2, WO01/41512A1, WO02/02714A2, WO02/15645A1, WO02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP1211257, JP-A Nos. 2002-226495, 2002-234894, 2001-247859, 2001-298470, 2002-173674, 2002-203678, 2002-203679, and 2004-357791, Japanese Patent Application Nos. 2005-75340 and 2005-75341, etc. Among these, more preferable examples of the luminescent dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred.

The phosphorescent emission material is not particularly limited, but an ortho-metal complex or a porphyrin metal complex is preferred.

The ortho-metal complex referred to herein is a generic designation of a group of compounds described in, for instance, Akio Yamamoto, *Yuki Kinzoku Kagaku, Kiso to Oyo* ("*Organic Metal Chemistry, Fundamentals and Applications*")(Shokabo, 1982), p. 150 to 232, and H. Yersin, *Photochemistry and Photophysics of Coordination Compounds* (New York: Springer-Verlag, 1987), p. 71-77 and p. 135-146. The ortho-metal complex can be advantageously used as a light emitting material because high brightness and excellent emitting efficiency can be obtained.

As a ligand that forms the ortho-metal complex, various kinds can be cited and are described in the above-mentioned literature as well. Examples of preferable ligands include a 2-phenylpyridine derivative, a 7,8-benzoquinoline derivative, a 2-(2-thienyl)pyridine derivative, a 2-(1-naphtyl)pyridine derivative and a 2-phenylquinoline derivative. The derivatives may be substituted by a substituent as needs arise. Furthermore, the ortho-metal complex may have other ligands than the ligands mentioned above.

An ortho-metal complex used in the present invention can be synthesized according to various kinds of known processes such as those described in Inorg. Chem., 1991, Vol. 30, p. 1685; Inorg. Chem., 1988, Vol. 27, p. 3464; Inorg. Chem., 1994, Vol. 33, p. 545; Inorg. Chim. Acta, 1991, Vol. 181, pp. 245; J. Organomet. Chem., 1987, Vol. 335, pp. 293 and J. Am. Chem. Soc., 1985, Vol. 107, p. 1431.

Among the ortho-metal complexes, compounds emitting from a triplet exciton can be preferably employed in the present invention from the viewpoint of improving emission efficiency.

In the present invention, the light emitting layer comprises a phosphorescence luminescent organic metal complex containing platinum as a central metal at a higher density in a region of the light emitting layer in the vicinity of the positive hole transport layer, and a phosphorescence luminescent organic metal complex containing iridium as a central metal at a higher density in a region thereof in the vicinity of the electron transport layer.

<<Phosphorescence Luminescent Organic Metal Complex Containing Platinum as a Central Metal>>

Specific examples of compounds for the phosphorescence luminescent organic metal complex containing platinum as a central metal include compounds as described bellow, but it should be noted that the present invention is not limited thereto.

Pt-1
Pt-2
Pt-3
PtOEP

Ir(piq)3
(btp)2Ir(acac)
Ir(ppy)3
Ir(ppy)2(ppz)
FIrpic

A platinum complex Pt-1 is a green luminescent platinum complex, a platinum complex Pt-2 is a cyan luminescent platinum complex, a platinum complex Pt-3 is a blue luminescent platinum complex, and a platinum complex PtOEP is a magenta luminescent platinum complex.

<<Phosphorescence Luminescent Organic Metal Complex Containing Iridium as a Central Metal>>

The iridium compound used in the present invention is a phosphorescence luminescent organic metal complex containing iridium as a central metal.

Specific examples of compounds for the phosphorescence luminescent organic metal complex containing iridium as a central metal include compounds described bellow, but it should be noted that the present invention is not limited thereto.

$Ir(piq)_3$ and $(btp)_2Ir(acac)$ are magenta luminescent iridium complexes, $Ir(ppy)_3$ and $Ir(ppy)_2(ppz)$ are green luminescent iridium complexes, and FIrpic is a cyan luminescent iridium complex.

The light emitting layer in the present invention may include a hole transporting material, an electron transporting material and a host material, if necessary.

Preferable specific examples of combinations of the metal complexes boased on the Ea values and Ip values are shown in Table 1 below, but it should be noted that the present invention is not limited thereto.

The electric charge-generating layer is formed by any material as long as it satisfies for the aforementioned functions, and may be formed by a single compound or a plurality of compounds.

TABLE 1

| Combination No. | First Phosphorescence Luminescent Material | | | | Second Phosphorescence Luminescent Material | | | | $\Delta$Ip (eV) | $\Delta$Ea (eV) |
|---|---|---|---|---|---|---|---|---|---|---|
| | Material No. | Emitting Wavelength | Ip (eV) | Ea (eV) | Material No. | Emitting Wavelength | Ip (eV) | Ea (eV) | | |
| 1 | (btp)$_2$Ir(acac) | 620 nm | 5.4 | 3.1 | Ir(piq)$_3$ | 620 nm | 5.5 | 3.2 | 0.1 | 0.1 |
| 2 | Ir(ppy)$_3$ | 515 nm | 5.4 | 2.7 | Pt-1 | 503 nm | 5.8 | 2.9 | 0.4 | 0.2 |
| 3 | Ir(ppy)$_3$ | 515 nm | 5.4 | 2.7 | Ir(ppy)$_2$(ppz) | 511 nm | 5.8 | 3.1 | 0.4 | 0.4 |
| 4 | Pt-1 | 503 nm | 5.8 | 2.9 | Ir(ppy)$_2$(ppz) | 511 nm | 5.8 | 3.1 | 0 | 0.2 |
| 5 | FIrpic | 473 nm | 5.8 | 2.9 | Pt-2 | 474 nm | 5.9 | 3 | 0.1 | 0.1 |
| 6 | FIrpic | 473 nm | 5.8 | 2.9 | Pt-3 | 457 nm | 6.1 | 3.1 | 0.3 | 0.2 |
| 7 | Pt-2 | 474 nm | 5.9 | 3 | Pt-3 | 457 nm | 6.1 | 3.1 | 0.2 | 0.1 |

A host material is the one having a function of energy transfer from an excitation state thereof to a fluorescent light emitting material or a phosphorescent light emitting material, thereby allowing the fluorescent light emitting material or the phosphorescent light emitting material to emit.

As the host material, as long as a compound can transfer exciton energy to a light emitting material, any compound can be appropriately selected and used depending on an application without particular restriction. Specific examples thereof include: a carbazole derivative; a triazole derivative; an oxazole derivative; an oxadiazole derivative; an imidazole derivative; a polyarylalkane derivative; a pyrazoline derivative; a pyrazolone derivative; a phenylenediamine derivative; an arylamine derivative; an amino-substituted chalcone derivative; a styrylanthracene derivative; a fluorenone derivative; a hydrazone derivative; a stilbene derivative; a silazane derivative; an aromatic tertiary amine compound; a styrylamine compound; an aromatic dimethylidene-based compound; a porphyrin-based compound; an anthraquinonedimethane derivative; an anthrone derivative; a diphenylquinone derivative; a thiopyran dioxide derivative; a carbodiimide derivative; a fluorenylidenemethane derivative; a distyrylpyrazine derivative; heterocyclic tetracarboxylic anhydrides such as naphthalene perylene; a phthalocyanine derivative; various kinds of metal complexes typified by metal complexes of a 8-quinolinol derivative, metal phthalocyanine, and metal complexes with benzoxazole or benzothiazole as a ligand; polysilane compounds; a poly(N-vinylcarbazole) derivative; an aniline-based copolymer; electric conductive polymers or oligomers such as a thiophene oligomer and polythiophene; polymer compounds such as a polythiophene derivative, a polyphenylene derivative, a polyphenylenevinylene derivative and a polyfluorene derivative; and like. These compounds can be used singularly or in a combination of two or more.

A content of the host material in the light emitting layer is preferably in the range of 0 to 99.9% by weight and more preferably in the range of 0 to 99.0% by weight.

5) Electric Charge-generating Layer

The organic electroluminescent element of the present invention may have a configuration of having an electric charge-generating layer provided between a plurality of the light emitting layers for a purpose to enhance luminescent efficiency.

The electric charge-generating layer has a function of generating electric charges (positive holes or electrons) during an application of an electric field as well as a function of injecting the generated electric charges into a layer adjacent to the electric charge-generating layer.

Specific examples of the materials for the electric charge-generating layer include electric conductive materials, semiconductive materials such as doped organic compounds, electric insulating materials, and materials disclosed in JP-A Nos. 11-329748, 2003-272860 and 2004-39617.

More specific examples thereof include transparent electric conductive materials such as indium tin oxide (ITO) and indium zinc oxide (IZO); fullerenes such as C60; electric conductive organic substances such as thiophene oligomers; electric conductive organic substances such as metal phthalocyanines, non-metal phthalocyanines, metal porphyrins and non-metal porphyrins; metal materials such as Ca, Ag, Al, Mg—Ag alloy and Al—Li alloy; positive hole conductive materials; electro conductive materials, and mixtures thereof.

Specific examples of the positive hole conductive material include positive hole transfer organic materials such as 2-TNATA or NPD doped with oxidants having electron attracting properties such as F4-TCNQ, TCNQ, or FeCl$_3$, P-type electric conductive polymers, and P-type semiconductors. Specific examples of the electro conductive materials include the electron transport organic materials doped with metals or metal compounds having a work function of less than 4.0 eV, N-type electric conductive polymers, and an N-type semiconductors. Specific examples of the N-type semiconductors include N-type Si, N-type CdS, N-type ZnS and the like. Specific examples of the P-type semiconductors include P-type Si, P-type CdTe, P-type CuO and the like.

Further, the electric charge-generating layer may use an electric insulating material such as V$_2$O$_5$.

The electric charge-generating layer can be formed by a single layer or a lamination of a plurality of layers. Specific examples of the laminations of the plurality of layers include a lamination of an electric conductive material such as a transparent conductive material or a metal material and a positive hole conductive material, a lamination of electro conductive materials, and a lamination of the positive hole conductive material and the electro conductive material described above, and the like.

Preferably, a film thickness or a material in the electric charge-generating layer can be selected such that a transmittance of visible light has 50% or more. Further, the film thickness is not particularly limited; however, it is preferably 0.5 to 200 nm, more preferably 1 to 100 nm, further preferably 3 to 50 nm and most preferably 5 to 30 nm.

The method of preparing the electric charge-generating layer is not particularly limited, and the above-described method of preparing organic compound layers can also be used.

The electric charge-generating layer is formed between the two or more light emitting layers. However, a material having a function of injecting an electric charge into layers adjacent thereto may be contained in a region of an anode side or in a cathode side of the electric charge-generating layer. In order to increase injection properties of electrons into layers adjacent at the anode side thereof, electron injection compounds such as BaO, SrO, $Li_2O$, LiCl, LiF, $MgF_2$, MgO, and $CaF_2$ may be laminated on the electric charge-generating layer at the anode side thereof.

Other than the materials according to the contents herein, materials for forming the electron charge generating layer may be selected on the basis of the descriptions in JP-A No. 2003-45676, and U.S. Pat. Nos. 6,337,492, 6,107,734, and 6,872,472.

6) Blocking Layer

In the present invention, a blocking layer may be disposed between the light emitting layer and the electron-transport layer. The blocking layer is a layer that inhibits excitons generated in the light emitting layer from diffusing and holes from penetrating to a cathode side.

A material that is used in the blocking layer may be a general electron transporting material, as long as it can receive electrons from the electron-transport layer and deliver them to the light emitting layer, without being particularly restricted. Examples thereof include a triazole derivative; an oxazole derivative; an oxadiazole derivative; a fluorenone derivative; an anthraquinodimethane derivative; an anthrone derivative; a diphenylquinone derivative; a thiopyran dioxide derivative; a carbodiimide derivative; a fluorenylidenemethane derivative; a distyrylpyrazine derivative; heterocyclic tetracarboxylic anhydrides such as naphthalene perylene; a phthalocyanine derivative; various kinds of metal complexes typical in metal complexes of a 8-quinolinol derivative, metal phthalocyanine, and metal complexes with benzoxazole or benzothiazole as a ligand; electric conductive polymer oligomers such as an aniline-based copolymer, a thiophene oligomer and polythiophene; and polymer compounds such as a polythiophene derivative, a polyphenylene derivative, a polyphenylenevinylene derivative and a polyfluorene derivative. These can be used singularly or in a combination of two or more.

7) Electron-transport Layer

In the present invention, an electron-transport layer including an electron transporting material can be disposed.

The electron transporting material can be used without particular restriction, as long as it has either one of a function of transporting electrons or a function of blocking holes injected from the an anode. The electron transporting materials that were cited in the explanation of the blocking layer can be preferably used.

A thickness of the electron-transport layer is preferably 10 nm to 200 nm and more preferably 20 nm to 80 nm.

When the thickness exceeds 200 nm, the driving voltage increases in some cases. When it is less than 10 nm, a electric shortening of the light-emitting element may be occurred, which is not preferable.

8) Electron-injection Layer

In the present invention, an electron-injection layer can be disposed between the electron-transport layer and the cathode.

The electron-injection layer is a layer by which electrons can be readily injected from the cathode to the electron-transport layer. Specifically, lithium salts such as lithium fluoride, lithium chloride and lithium bromide; alkali metal salts such as sodium fluoride, sodium chloride and cesium fluoride; and electric insulating metal oxides such as lithium oxide, aluminum oxide, indium oxide and magnesium oxide can be preferably used.

A film thickness of the electron-injection layer is preferably 0.1 nm to 5 nm.

In the organic EL device of the invention, an electron donating dopant may be contained in the electron injection layer or the electron transport layer. As a material applied for the electron-donating dopant with respect to the electron injection layer or the electron-transport layer, any material may be used as long as it has an electron-donating property and a property for reducing an organic compound, and alkaline metals such as Li, alkaline earth metals such as Mg, and transition metals including rare-earth metals are preferably used. Particularly, metals having a work function of 4.2 V or less are preferably applied, and specific examples thereof include Li, Na, K, Be, Mg, Ca, Sr, Ba, Y, Cs, La, Sm, Gd, and Yb. Also examples of the organic reducing compound include a nitrogen-containing compound, a sulfur-containing compound and a phosphorus-containing compound.

In addition, there may be utilized materials described in JP-A Nos. 6-212153, 2000-196140, 2003-68468, 2003-229278 and 2004-342614.

These electron-donating dopants may be used alone or in a combination of two or more of them.

An applied amount of the electron-donating dopants differs dependent on the types of the materials, but it is preferably 0.1% by weight to 99% by weight with respect to an electron-transport layer material, more preferably 1.0% by weight to 80% by weight, and particularly preferably 2.0% by weight to 70% by weight.

When the thickness exceeds 200 nm, the driving voltage increases in some cases. When it is less than 10 nm, a electric shortening of the light-emitting element may be occurred, which is not preferable.

9) Producing Method of Element

The respective layers that constitute an element in the present invention can be preferably formed by any method of dry layering methods such as a vapor deposition method and a sputtering method, and wet layering methods such as a dipping method, a spin coating method, a dip coating method, a casting method, a die coating method, a roll coating method, a bar coating method, a gravure coating method and the like.

Among these, from the viewpoints of emission efficiency and durability, the dry methods are preferable.

10) Substrate

The substrate to be applied in the present invention is preferably impermeable to moisture or very slightly permeable to moisture. Furthermore, the substrate preferably does not scatter or attenuate light emitted from the organic compound layer. Specific examples of materials for the substrate include YSZ (zirconia-stabilized yttrium); inorganic materials such as glass; polyesters such as polyethylene terephthalate, polybutylene phthalate and polyethylene naphthalate; and organic materials such as polystyrene, polycarbonate, polyethersulfon, polyarylate, aryldiglycolcarbonate, polyimide, polycycloolefin, norbornene resin, poly(chlorotrifluoroethylene), and the like.

In case of employing an organic material, it is preferred to use a material excellent in heat resistance, dimensional stability, solvent-resistance, electrical insulation, workability, low air-permeability, and low moisture-absorption. These can be used singularly or in a combination of two or more.

There is no particular limitation as to the shape, the structure, the size and the like of the substrate, but it may be suitably selected according to the application, the purposes and the like of the luminescent device. In general, a plate-like substrate is preferred as the shape of the substrate. The structure of the substrate may be a monolayer structure or a laminated structure. Furthermore, the substrate may be formed from a single member or from two or more members.

Although the substrate may be in a transparent and colorless, or a transparent and colored condition, it is preferred that the substrate is transparent and colorless from the viewpoint that the substrate does not scatter or attenuate light emitted from the organic emissive layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In case of applying a thermoplastic substrate, a hard-coat layer or an under-coat layer may be further provided as necessary.

11) Anode

An anode in the present invention may generally have a function as an electrode for supplying positive holes to the organic compound layer, and while there is no particular limitation as to the shape, the structure, the size and the like, it may be suitably selected from among well-known electrode materials according to the application and the purpose thereof.

As materials for the anode, for example, metals, alloys, metal oxides, electric conductive compounds, and mixtures thereof are preferably used, wherein those having a work function of 4.0 eV or more are preferred. Specific examples of the anode materials include electric conductive metal oxides such as tin oxides doped with antimony, fluorine or the like (ATO, and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide, and copper sulfide; organic electric conductive materials such as polyaniline, polythiophene, and polypyrrole; and laminates of these inorganic or organic electron-conductive materials with ITO.

The anode may be formed on the substrate, for example, in accordance with a method which is appropriately selected from among wet methods such as a printing method, and a coating method and the like; physical methods such as a vacuum deposition method, a sputtering method, and an ion plating method and the like; and chemical methods such as CVD and plasma CVD methods and the like with consideration of the suitability with a material constituting the anode. For instance, when ITO is selected as a material for the anode, the anode may be formed in accordance with a DC or high-frequency sputtering method, a vacuum deposition method, an ion plating method or the like.

In the organic electroluminescence device of the present invention, a position at which the anode is to be formed is not particularly restricted, but it may be suitably selected according to the application and the purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, and a lift-off method or a printing method may be applied.

A thickness of the anode may be suitably selected dependent on the material constituting the anode, and is not definitely decided, but it is usually in the range of around 10 nm to 50 µm, and 50 nm to 20 µm is preferred.

A value of electric resistance of the anode is preferably $10^3$ $\Omega/\square$ or less, and $10^2$ $\Omega/\square$ or less is more preferable.

The anode in the present invention can be colorless and transparent or colored and transparent. For extracting luminescence from the transparent anode side, it is preferred that a light transmittance of the anode is 60% or higher, and more preferably 70% or higher. The light transmittance in the present invention can be measured by means well known in the art using a spectrophotometer.

In the present invention, an electrode previously provided at the transparent substrate is preferably light transparent electrode in order to introduce effectively the emitted light into a transparent substrate, thereby serving as a light conducting member. As an anode electrode, ITO is particularly preferable.

Concerning the transparent anode, there is a detailed description in "TOUMEI DENNKYOKU-MAKU NO SHINTENKAI (Novel Developments in Transparent Electrode Films)" edited by Yutaka Sawada and published by C.M.C. in 1999, the contents of which are incorporated by reference herein. In the case where a plastic substrate of a low heat resistance is applied, it is preferred that ITO or IZO is used to obtain a transparent anode prepared by forming the film at a low temperature of 150° C. or lower.

12) Cathode

The cathode in the present invention may generally have a function as an electrode for injecting electrons to the organic compound layer, and there is no particular restriction as to the shape, the structure, the size and the like. Accordingly, the cathode may be suitably selected from among well-known electrode materials.

As the materials constituting the cathode, for example, metals, alloys, metal oxides, electric conductive compounds, and mixtures thereof may be used, wherein materials having a work function of 4.5 eV or less are preferred. Specific examples include alkali metals (e.g., Li, Na, K, Cs or the like); alkaline earth metals (e.g., Mg, Ca or the like); gold; silver; lead; aluminum; sodium-potassium alloys; lithium-aluminum alloys; magnesium-silver alloys; rare earth metals such as indium and ytterbium; and the like. They may be used alone, but it is preferred that two or more of them are used in combination from the viewpoint of satisfying both of stability and electron injectability.

Among these, as the materials for constituting the cathode, alkaline metals or alkaline earth metals are preferred in view of electron injectability, and materials containing aluminum as the major component are preferred in view of excellent preservation stability.

The term "material containing aluminum as the major component" refers to a material that material exists in the form of aluminum alone; alloys comprising aluminum and 0.01% by weight to 10% by weight of an alkaline metal or an alkaline earth metal; or mixtures thereof (e.g., lithium-aluminum alloys, magnesium-aluminum alloys and the like).

As for materials for the cathode, they are described in detail in JP-A Nos. 2-15595 and 5-121172, the contents of which are incorporated by reference herein.

A method for forming the cathode is not particularly limited, but it may be formed in accordance with a well-known method. For instance, the cathode may be formed in accordance with a method which is appropriately selected from among wet methods such as a printing method, and a coating method and the like; physical methods such as a vacuum deposition method, a sputtering method, and an ion plating method and the like; and chemical methods such as CVD and plasma CVD methods and the like, while taking the suitability to a material constituting the cathode into consideration. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, and a lift-off method or a printing method may be applied.

In the present invention, a position at which the cathode is to be formed is not particularly restricted, but it may be formed on either the whole or a part of the organic compound layer.

Furthermore, a dielectric material layer made of a fluoride, an oxide or the like of an alkaline metal or an alkaline earth metal may be inserted in between the cathode and the organic compound layer with a thickness of 0.1 nm to 5 nm, wherein the dielectric layer may serve as one kind of electron injection layer. The dielectric material layer may be formed in accordance with, for example, a vacuum deposition method, a sputtering method, an ion-plating method or the like.

A thickness of the cathode may be suitably selected dependent on materials for constituting the cathode and is not definitely decided, but it is usually in the range of around 10 nm to 5 µm, and 50 nm to 1 µm is preferred.

Moreover, the cathode may be transparent or opaque. The transparent cathode may be formed by preparing a material for the cathode with a small thickness of 1 nm to 10 nm, and further laminating a transparent electric conductive material such as ITO or IZO thereon.

2. Other Element Constituent Materials
(Resin Sealing Layer)

In the functional device of the invention it is preferred to suppress the degradation of the device performance caused by contact with atmospheric air or oxygen or water content by means of a resin seal layer.

<Material>

The resin material for the resin seal layer is not particularly restricted and acrylic resin, epoxy resin, fluoro resin, silicone resin, rubber resin, or ester resins can be used. Among them, the epoxy resin is preferred with a view point of water content preventive function. In the epoxy resin, thermosetting epoxy resin, or photo-curable epoxy resin is preferred.

<Manufacturing Method>

The manufacturing method of the resin seal layer is not particularly restricted and includes, for example, a method of coating a resin solution, a method of press bonding or hot press bonding a resin sheet or a method of dry polymerization by vapor deposition or sputtering, etc.

<Film Thickness>

The thickness of the resin seal layer is 1 µm or more and, preferably, 1 mm or less. It is more preferably 5 µm or more and 100 µm or less and, most preferably, 10 µm or more and 50 µm or less. In a case where the thickness is smaller, the inorganic film may possibly be damaged upon mounting of the second substrate. Further, in a case where the thickness is larger, the thickness of the electroluminescence device per se increases to damage the thin film property as a feature of the organic electroluminescence device.

(Sealing Adhesive)

The sealing adhesive used in the invention has a function of preventing intrusion of water content or oxygen from the edge.

<Material>

As the material for the sealing adhesive, those identical with the materials used in the resin sealing layer can be used. Among all, an epoxy type adhesive is preferred with a view point of preventing water content and, particularly, a photo-curable epoxy type adhesive is preferred.

Further, addition of a filler to the materials described above is also preferred. The filler added to the sealant is preferably inorganic materials such as $SiO_2$, SiO (silicon oxide), SiON (silicon oxynitride), or SiN (silicon nitride). The addition of the filler increases the viscosity of the sealant to improve the producibility and improve the humidity resistance.

<Drying Agent>

The sealing adhesive may also contain a drying agent, the drying agent is preferably barium oxide, calcium oxide, or strontium oxide.

The addition amount of the drying agent to the sealing adhesive is, preferably, 0.01% by weight or more and 20% by weight or less and, more preferably, 0.05% by weight or more and 15% by weight or less. The addition effect of the drying agent is reduced in a case where the amount is smaller. Further, it is difficult to uniformly disperse the drying agent in the sealing adhesive in a case where the amount is larger, which is not preferred.

<Formulation of Sealing Adhesive>

Polymer Composition, Concentration

The sealing adhesive is not particularly restricted and those described above can be used. For example, the photo-curable epoxy adhesive includes XNR5516 manufactured by Nagase Chemtech Co. and the drying agent may be added to and dispersed therein.

Thickness

The coating thickness of the sealing adhesive is preferably 1 µm or more and 1 mm or less. In a case where the thickness is smaller, the sealing adhesive can not be coated uniformly, which is not preferred. Further, in a case where the thickness is larger, water content intrusion paths are increased, which is not preferred.

<Sealing Method>

In the invention, the sealing adhesive incorporated with the drying agent is coated in an optional amount by a dispenser or the like, a second substrate is stacked after coating, and they can be cured to obtain a functional device.

3. Display

The organic electroluminescent element of the present invention can be suitably used for both the passive matrix drive display and the active matrix drive display. The features of the organic electroluminescent element of the present invention can be exhibited more preferably by the passive matrix drive display. The organic electroluminescent element of the present invention can emit light with high luminance and with high luminescent efficiency even in a high current density region, and also has excellent durability. Further, it can consistently obtain sufficiently high luminance even in the passive matrix drive display using the phosphorescence light emitting material.

In particular, the organic electroluminescent element of the present invention can exhibit high luminescent efficiency and high luminance in a display which is driven at a current density of 10 $mA/cm^2$ or more.

In the organic electroluminescence device of the present invention, when a DC (AC components may be contained as needed) voltage (usually 2 volts to 15 volts) or DC is applied across the anode and the cathode, luminescence can be obtained.

The driving durability of the organic electroluminescence device according to the present invention can be determined based on the brightness halftime at a specified brightness. For instance, the brightness halftime may be determined by using a source measure unit, model 2400, manufactured by KEITHLEY Instruments Inc. to apply a DC voltage to the organic EL device to cause it to emit light, conducting a continuous driving test under the condition that the initial brightness is 2000 cd/m², defining the time required for the brightness to reach 1000 cd/m² as the brightness halftime T (½), and then comparing the resulting brightness halftime with that of a conventional luminescent device. According to the present invention, the numerical value thus obtained was used.

An important characteristic parameter of the organic electroluminescence device of the present invention is external quantum efficiency. The external quantum efficiency is calculated by "the external quantum efficiency ($\phi$)=the number of photons emitted from the device/the number of electrons injected to the device", and it may be said that the larger the value obtained is, the more advantageous the device is in view of electric power consumption.

Moreover, the external quantum efficiency of the organic electroluminescence device is decided by "the external quantum efficiency ($\phi$))=the internal quantum efficiency×light-extraction efficiency". In an organic EL device which utilizes the fluorescent luminescence from the organic compound, an upper limit of the internal quantum efficiency is 25%, while the light-extraction efficiency is about 20%, and accordingly, it is considered that an upper limit of the external quantum efficiency is about 5%. Further, in the organic electroluminescent element using the phosphorescent light from organic metal complexes, the upper limit value of internal quantum efficiency is 100%, and the light extracting efficiency thereof is about 20%, whereby the upper limit value of external quantum efficiency is 20%.

From the standpoint of reducing power consumption and increasing driving durability, the external quantum efficiency of a device is preferably 6% or more, and particularly preferably 12% or more.

According to the present invention, a value obtained by the following method is used. Namely, a DC constant voltage is applied to the EL device by the use of a source measure unit, model 2400, manufactured by Toyo TECHNICA Corporation to cause it to emit light, the brightness of the light is measured by using a brightness photometer (trade name: BM-8, manufactured by Topcon Corporation), and then, the external quantum efficiency at 200 cd/m² is calculated.

Further, an external quantum efficiency of the luminescent device may be obtained by measuring the luminescent brightness, the luminescent spectrum, and the current density, and calculating the external quantum efficiency from these results and a specific visibility curve. In other words, using the current density value, the number of electrons injected can be calculated. By an integration calculation using the luminescent spectrum and the specific visibility curve (spectrum), the luminescent brightness can be converted into the number of photons emitted. From the result, the external quantum efficiency (%) can be calculated by "(the number of photons emitted/the number of electrons injected to the device)×100".

For the driving method of the organic electroluminescence device of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

(Application of the Organic Electroluminescence Element of the Present Invention)

The organic electroluminescence element of the present invention can be appropriately used for indicating elements, displays, backlights, electronic photographs, illumination light sources, recording light sources, exposure light sources, reading light sources, signages, advertising displays, interior accessories, optical communications and the like. The luminescent element of the present invention is preferably used for a device which is driven in a range of high light-emitting luminance, such as the passive matrix drive display and the like.

EXAMPLES

In the following examples, the electroluminescent element of the invention will be specifically described, but it should be noted that the present invention is not limited to these examples.

Example 1

1. Measurements of Ea Values, Ip Values and Light Emission Spectra for Light Emitting Materials
(Measurements of Ea Values and Ip Values)

Ea values and Ip values of three light emitting materials, such as mCP, Ir(ppy)$_3$ and platinum complex Pt-1, were measured as follows.

Films for measurement were prepared by a vapor deposition on a glass substrate at a film thickness of 100 nm. Ip value of the obtained samples was measured by Spectrophotometer AC-2 (manufactured by Riken Keiki Co., Ltd.) at a light intensity of 20 nW under an ambient atmospheric environment.

Further, films for measurement were prepared by a vapor deposition on a quartz substrate at a film thickness of 100 nm. A spectral absorption of samples obtained over wavelengths of 180 nm to 700 nm was measured by using a Hitachi Spectrophotometer Model U3310 (manufactured by Hitachi Ltd.). Then, an energy gap value (Eg(ev)) was calculated from the absorption end of the obtained absorption spectrum at the longest wavelength side thereof Ea value was calculated by the following equation (1) on the basis of the obtained Eg value and Ip value:

$$Ea(\text{ev})=Eg(\text{eV})-Ip(\text{eV}) \quad (1)$$

The obtained value is shown in Table 2. Among the measured phosphorescence light emitting materials, Ir (ppy)$_3$ had the minimum Ip value, and the platinum complex Pt-1 had the maximum Ep value.

TABLE 2

| Light Emitting Material | Ip (eV) | Ea (eV) |
|---|---|---|
| mCP | 6 | 2.3 |
| Ir(ppy)$_3$ | 5.4 | 2.7 |
| Pt-1 | 5.8 | 2.9 |

(Measurement of Light Emission Spectrum of Light Emitting Material)

Sample A for measurement: a light emitting layer comprising mCP and Ir(ppy)$_3$ doped at an amount of 6.0% by weight with respect to mCP on a quartz substrate by a vacuum evaporation method at a film thickness of 50 nm.

Sample B for measurement: a light emitting layer comprising mCP and platinum complex Pt-1 at an amount of 15.0% by weight with respect to mCP at a thickness of 50 nm.

Figure 1:
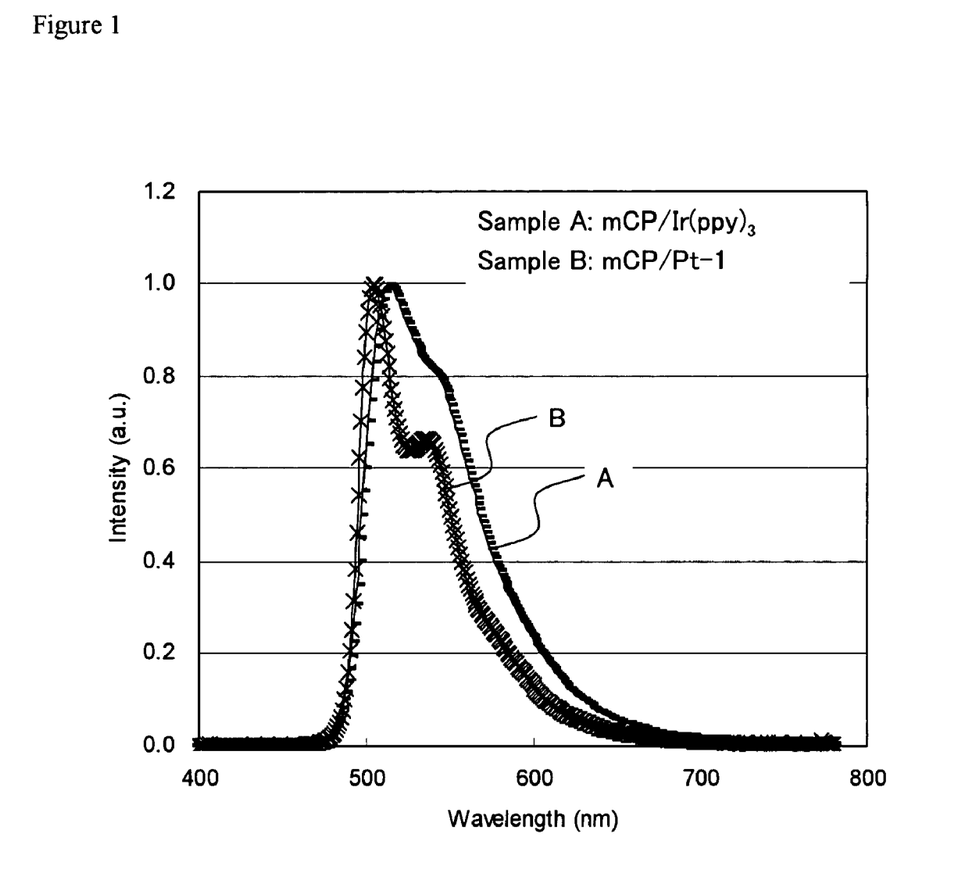
FIG. 1 shows light emission spectra of light emitting materials. Sample A has a light emitting layer comprising mCP and Ir(ppy)$_3$ doped at an amount of 6.0% by weight with respect to mCP. Sample B is a sample for measurement comprising a light emitting layer having mCP and platinum complex Pt-1 doped at an amount of 15.0% by weight with respect to mCP.

The resultant samples were irradiated with an excitation light having a wavelength of 365 nm, and the light emission spectrum thereof was measured by Spectral Brightness Meter CS-1000 (manufactured by Konica Minolta Holdings, Inc.). The resultant light emission spectrum is shown in FIG. 1. The transversal axis shows wavelengths, and the vertical axis shows a normalized light intensity of light emission so that the light intensity at the peak wavelength as 1.0. Sample A showed luminescent peak at wavelengths of 513 nm. Sample B showed luminescent peak at wavelengths of 504 nm. The difference between the luminescent peak wavelengths was 9 nm, and thereby these samples are substantially in the samer color as each other.

2. Preparation of Organic EL Element

1) Preparation of Comparative Organic EL Element No. A1

A glass substrate having a thickness of 0.5 mm and a rectangular of 2.5 cm was put in a washing vessel, and washed with ultrasonic in 2-propanol, followed by an UV-ozone treatment for 30 minutes. The following layers were diposited on the transparent anode by a vacuum evaporation method. The evaporation speed of the vacuum evaporation method in Examples of the present invention is usually 0.2 nm/second unless it is insisted. The evaporation speed was measured by using a quartz resonator. The film thicknesses described below were also measured by the quartz resonator.

Anode: ITO (Indium Tin Oxide) was desposited on a grass substrate to have a film thickness of 100 nm.

Positive hole injection layer: 2-TNATA was deposited on the anode (ITO) at a film thickness of 140 nm.

Positive hole transport layer: α-NPD was desposited on the positive hole injection layer at a film thickness of 7 nm.

Second positive hole transport layer: an amine compound AM-1 was deposited on the positive hole transport layer at a film thickness of 3 nm.

Light emitting layer: a light emitting layer comprising mCP and Ir(ppy)$_3$ doped at an amount of 6.0% by weight with respect to mCP at a film thickness of 30 nm.

Electron transport layer: BAlq was deposited on the light emitting layer at a film thickness of 40 nm.

Electron injection layer: LiF was desposited on the electron transport layer at a film thickness of 1 nm.

Cathode: a patterned mask (having a luminescent region of 2 mm×2 mm) was set on the electron injection layer, and metal aluminum was deposited thereon at a film thickness of 100 nm, and thereby a cathode was prepared.

The prepared laminate was encased in an argon gas substituted glove box, and sealed by using a stainless steel can and an UV curable adhesive (XNR5516HV, manufactured by Nagase ChemTex Corporation). Thus, a comparative organic EL element No. A1 was obtained.

2) Preparation of Comparative n Organic EL Element No. A2

Comparative organic EL element No. A2 was prepared in the same manner as that in the preparation of the comparative organic EL element No. A1, except that a light emitting layer having mCP and platinum complex Pt-1 doped at an amount of 15.0% by weight with respect to mCP was used at a film thickness of 30 nm as the light emitting layer in the preparation of the the comparative organic EL element No. A1.

3) Preparation of Comparative Organic EL Element No. A3

Comparative organic EL element No. A3 was prepared in the same manner as that in the preparation of the comparative organic EL element No. A1, except that the following two light emitting layers were used as the light emitting layer.

Light emitting layer 1 (in the vicinity of the positive hole transport layer): a light emitting layer having mCP and Ir(ppy)$_3$ doped at an amount of 6.0% by weight with respect to mCP at a film thickness of 15 nm.

Light emitting layer 2 (in the vicinity of the electron transport layer): a light emitting layer having mCP and platinum complex Pt-1 doped at an amount of 15.0% by weight with respect to mCP at a film thickness of 15 nm.

4) Preparation of Comparative Organic EL Element No. A4

Comparative organic EL element No. A4 was prepared in the same manner as that in the preparation of the comparative organic EL element No. A1, except that the following light emitting layer was used, in the preparation of the comparative organic EL element No. A1.

Light emitting layer: a light emitting layer having mCP, Ir(ppy)$_3$ doped at an amount of 6.0% by weight and platinum complex Pt-1 doped at an amount of 6.0% by weight with respect to mCP at a film thickness of 30 nm.

5) Preparation of Organic EL Element No. 1 of the Present Invention

Organic EL element No. 1 was prepared in the same manner as that in the comparative organic EL element No. A1, except that the following two light emitting layers were used.

Light emitting layer 1 (in the vicinity of the positive hole transport layer): a light emitting layer having mCP and platinum complex Pt-1 doped at an amount of 15.0% by weight at a film thickness of 15 nm.

Light emitting layer 2 (in the vicinity of the electron transport layer): a light emitting layer having mCP and Ir(ppy)$_3$ doped at an amount of 6.0% by weight with respect to mCP at a film thickness of 15 nm.

6) Preparation of Organic EL Element No. 2 of the Present Invention

Organic EL element No. 2 was prepared in the same manner as that in the organic EL element A1, except that the following three light emitting layers were used as the light emitting layer in the preparation of the comparative organic EL element No. A1.

Light emitting layer 1 (in the vicinity of the positive hole transport layer): a light emitting layer having mCP and platinum complex Pt-1 doped at an amount of 15.0% by weight with respect to mCP at a film thickness of 10 nm.

Light emitting layer 2 (interposed between the light emitting layer 1 and the light emitting layer 2): a light emitting layer having mCP and Ir(ppy)$_3$ doped at an amount of 6.0% by weight, platinum complex Pt-1 doped at an amount of 15.0% by weight with respect to mCP at a film thickness of 10 nm.

Light emitting layer 3 (in the vicinity of the electron transport layer): a light emitting layer having mCP and Ir(ppy)$_3$ doped at an amount of 6.0% by weight with respect to mCP at a film thickness of 10 nm.

The structure of the compounds used for preparing the luminescent elements are shown below.

Amine Compound AM-1

3. Evaluation of Performances
(Evaluation Items)
External Luminescence Quantum Efficiency The external luminescence quantum efficiency was measured at the luminance of 1,000 cd/m² and 30,000 cd/m² by changing a driving current density. A spectral brightness at a front surface of the organic EL element was measured by Spectral Brightness Meter CS-1000 (manufactured by Konica Minolta Holdings, Inc.), and by assuming that the angle dependency of an irradiation intensity is under Lambertian Rule, an irradiation intensity for each wavelength was converted to the number of emitted photons, and a ratio of the number of the emitted photons to the driving current density was calculated, whereby the external luminescence quantum efficiency was obtained.

(Result of Evaluation)

The results are shown in Table 3.

As is apparent from Table 3, it is noted that the organic EL element of the present invention provides extremely high external quantum efficiency at a light emission of 30,000 cd/m² by increasing of a current density. Further, the external quantum efficiency at such high brightness is not deteriorated but rather increased compared with that at a relatively low brightness of 1,000 cd/m². Furthermore, as it is not shown in Table 3, the luminance color is not changed even at high brightness of 30,000 cd/m or at low brightness of 1,000 cd/m₂.

On the other contrary, the external quantum efficiency of the comparative organic EL elements is noticeably deteriorated in a light emission at high brightness of 30,000 cd/m².

In the passive matrix drive display, each pixel at pixel portions is required to instantaneously emit light of high brightness through high current density. The luminescent element of the present invention is designed to provide high luminescent efficiency in such case, and accordingly, is advantageously applied thereto.

TABLE 3

| | External Quantum Efficiency | |
|---|---|---|
| Sample No. | at 1,000 cd/m² | at 30,000 cd/m² |
| Comaparative Sample No. A1 | 9.9 | 4.2 |
| Comaparative Sample No. A2 | 10.3 | 4.8 |
| Comaparative Sample No. A3 | 12.6 | 5.6 |
| Comaparative Sample No. A4 | 11.4 | 4.8 |
| Inventive Sample No. 1 | 6.2 | 9.3 |
| Inventive Sample No. 2 | 7.1 | 9.2 |

Example 2

1. Preparation of Organic EL Element
1) Preparation of Comparative Organic EL Element No. B1

A glass substrate having a thickness of 0.5 mm and a rectangular of 2.5 cm was put in a washing vessel, and washed with ultrasonic in 2-propanol, followed by an UV-ozone treatment for 30 minutes. The following layers were diposited on the transparent anode by a vacuum evaporation method. The evaporation speed of the vacuum evaporation method in Examples of the present invention is usually 0.2 nm/second unless it is insisted. The evaporation speed was measured by using a quartz resonator. The film thicknesses described below were also measured by the quartz resonator.

Anode: ITO (Indium Tin Oxide) was desposited on a grass substrate to have a film thickness of 100 nm.

Positive hole injection layer: 2-TNATA was deposited on the anode (ITO) at a film thickness of 100 nm.

Positive hole transport layer: α-NPD was desposited on the positive hole injection layer at a film thickness of 7 nm.

Second positive hole transport layer: an amine compound AM-1 was deposited on the positive hole transport layer at a film thickness of 3 nm.

Light emitting layer: two light emitting layers as described bellow were deposited on the above second positive hole transport layer.

Light emitting layer 1: a light emitting layer having mCP and FIrpic doped at an amount of 8.0% by weight with respect to mCP at a film thickness of 15 nm.

Light emitting layer 2: a light emitting layer having mCP and (btp)2Ir(acac) doped at an amount of 8.0% by weight with respect to mCP at a film thickness of 15 nm.

Electron transport layer: BAlq was deposited on the light emitting layer at a film thickness of 40 nm.

Electron injection layer: LiF was desposited on the electron transport layer at a film thickness of 1 nm.

Cathode: a patterned mask (having a luminescent region of 2 mm×2 mm) was set on the electron injection layer, and metal aluminum was deposited thereon at a film thickness of 100 nm, and thereby a cathode was prepared.

The prepared laminate was encased in an argon gas substituted glove box, and sealed by using a stainless steel can and an UV curable adhesive (XNR5516HV, manufactured by Nagase ChemTex Corporation). Thus, a comparative organic EL element No. B1 was obtained.

2) Preparation of Organic EL Element No. 3 of the Present Invention

Organic EL element No. 3 was prepared in the same manner as that in the comparative organic EL element No. B1, except that the following two light emitting layers were used.

Light emitting layer 1 (in the vicinity of the positive hole transport layer): a light emitting layer having mCP and platinum complex Pt-2 doped at an amount of 15.0% by weight with respect to mCP at a film thickness of 15 nm.

Light emitting layer 2 (in the vicinity of the electron transport layer): a light emitting layer having mCP and (btp)$_2$Ir(acac) doped at an amount of 8.0% by weight with respect to mCP at a film thickness of 15 nm.

2. Evaluation

The external luminescence quantum efficiency was measured at the luminance of 1,000 cd/m$^2$ and 10,000 cd/m$^2$ by changing a driving current density in the same manner as in Example 1.

The results are shown in Table 4.

Both of comparative sample No. B1 and inventive sample No. 3 showed white luminescent emission.

As is apparent from Table 4, it is noted that the organic EL element of the present invention provides extremely high external quantum efficiency at a light emission of 10,000 cd/m$^2$ by increasing of a current density. Further, the external quantum efficiency at such high brightness is not decreased but rather increased compared with that at a relatively low brightness of 1,000 cd/m$^2$. Furthermore, as it is not shown in Table 4, the luminance color is not changed even at high brightness of 10,000 cd/m$^2$ or at low brightness of 1,000 cd/m$^2$.

On the other contrary, the external quantum efficiency of the comparative organic EL elements is noticeably deteriorated in a light emission at high brightness of 30,000 cd/m$_2$.

In the passive matrix drive display, each pixel at pixel portions is required to instantaneously emit light of high brightness through high current density. The luminescent element of the present invention is designed to provide high luminescent efficiency in such case, and accordingly, is advantageously applied thereto.

TABLE 4

| | External Quantum Efficiency | |
|---|---|---|
| Sample No. | at 1,000 cd/m$^2$ | at 30,000 cd/m$^2$ |
| Comaparative Sample No. B1 | 5.9 | 2.1 |
| Inventive Sample No. 3 | 4.2 | 7.2 |

Example 3

Organic EL element Nos. 4-12 were prepared in the same manner as that in the organic EL element No. 3, except that a composition of the light emitting layers and the other layers was changed as described in Table 5. The samples obtained were evaluated in the same manner as that in Example 2.

As is apparent from Table 5, it is noted that the organic EL elements of the present invention provide extremely high external quantum efficiency at a high light emission, and thereby, it results to save a consumption of an electric power through driving at a high current density.

TABLE 5

| Sample No. | First Light Emitting Layer (Adjacent to Hole Transport Layer) | Thickness (nm) | Second Light Emitting Layer | Thickness (nm) | Third Light Emitting Layer (Adjacent to Electron Transport Layer) | Thickness (nm) | External Quantum Efficiency at 1,000 cd/m$^2$ | at 1,000 cd/m$^2$ |
|---|---|---|---|---|---|---|---|---|
| Inventive Sample No. 4 | mCP/15% by weight Pt-1 | 15 | — | — | mCP/8% by weight Ir(ppy)$_2$(ppz) | 15 | 6.3% | 9.3% |
| Inventive Sample No. 5 | mCP/3% by weight PtOEP | 15 | — | — | mCP/6% by weight (btp)$_2$Ir(acac) | 15 | 3.3% | 7.2% |
| Inventive Sample No. 6 | mCP/3% by weight PtOEP | 15 | — | — | mCP/6% by weight Ir(piq)$_3$ | 15 | 2.8% | 6.5% |
| Inventive Sample No. 7 | mCP/15% by weight Pt-2 | 15 | — | — | mCP/6% by weight FIrpic | 15 | 3.6% | 8.1% |
| Inventive Sample No. 8 | mCP/15% by weight Pt-2 | 15 | — | — | mCP/6% by weight (btp)$_2$Ir(acac) | 15 | 4.5% | 7.9% |
| Inventive Sample No. 9 | mCP/15% by weight Pt-2 | 15 | — | — | mCP/6% by weight Ir(piq)$_3$ | 15 | 4.2% | 7.8% |
| Inventive Sample No. 10 | mCP/3% by weight PtOEP | 15 | — | — | mCP/6% by weight FIrpic | 15 | 2.8% | 5.8% |
| Inventive Sample No. 11 | mCP/15% by weight Pt-2 | 10 | mCP/15% by weight Pt-1 | 10 | mCP/6% by weight Ir(piq)$_3$ | 10 | 4.7% | 9.1% |
| Inventive Sample No. 12 | mCP/15% by weight Pt-2 | 10 | mCP/6% by weight Ir(piq)$_3$ | 10 | mCP/6% by weight Ir(piq)$_3$ | 10 | 4.5% | 8.4% |

What is claimed is:

1. An organic electroluminescent element comprising at least a positive hole transport layer, a light emitting layer and an electron transport layer between at least a pair of electrodes, wherein the light emitting layer contains therein at least two light emitting materials having different electron affinity (Ea values) or ionization potentials (Ip values) and emitting phosphorescence having the same color as each other, and among the two light emitting materials, a light emitting material having a larger Ea value or Ip value is contained at a higher density in a region of the light emitting layer in the vicinity of the positive hole transport layer, while a light emitting material having a smaller Ea value or Ip value is contained at a higher density in a region of the light emitting layer in the vicinity of the electron transport layer.

2. The organic electroluminescent element according to claim 1, wherein Ea values of the two light emitting materials are different from each other.

3. The organic electroluminescent element according to claim 2, wherein the difference between the Ea values of the two light emitting materials is 0.1 eV to 0.5 eV.

4. The organic electroluminescent element according to claim 1, wherein Ip values of the two light emitting materials are different from each other.

5. The organic electroluminescent element according to claim 4, wherein the difference between the Ip values of the two light emitting materials is 0.1 eV to 0.5 eV.

6. The organic electroluminescent element according to claim 1, wherein both Ea values and Ip values of the two light emitting materials are different from each other.

7. The organic electroluminescent element according to claim 6, wherein the difference between the Ea values of the two light emitting materials is 0.1 eV to 0.5 eV, and the difference between the Ip values of the two light emitting materials is 0.1 eV to 0.5 eV.

8. The organic electroluminescent element according to claim 1, wherein the difference between peak wavelengths of light emission of the two light emitting materials is 30 nm or less.

9. The organic electroluminescent element according to claim 1, wherein the light emitting material contained at a higher density in a region of the light emitting layer in the vicinity of the positive hole transport layer is a platinum compound, and the light emitting material contained at a higher density in a region of the light emitting layer in the vicinity of the electron transport layer is an iridium compound.

10. The organic electroluminescent element according to claim 9, wherein the light emitting layer comprises at least two layers, and a first light emitting layer in the vicinity of the positive hole transport layer contains the platinum compound, and a second light emitting layer in the vicinity of the electron transport layer contains the iridium compound.

11. The organic electroluminescent element according to claim 9, wherein the platinum compound is a phosphorescence luminescent organic metal complex containing platinum as a central metal.

12. The organic electroluminescent element according to claim 11, wherein the platinum compound is a phosphorescence luminescent organic metal complex containing a tridentate ligand or a higher polydenate ligand.

13. The organic electroluminescent element according to claim 9, wherein the iridium compound is a phosphorescence luminescent organic metal complex containing iridium as a central metal.

14. The organic electroluminescent element according to claim 13, wherein the iridium compound is a phosphorescence luminescent organic metal complex containing a bidentate ligand or a higher polydenate ligand.

15. The organic electroluminescent element according to claim 9, wherein the platinum compound is a phosphorescence luminescent organic metal complex containing platinum as a central metal, and the iridium compound is a phosphorescence luminescent organic metal complex containing iridium as a central metal.

16. The organic electroluminescent element according to claim 15, wherein the platinum compound is a phosphorescence luminescent organic metal complex containing a tridentate ligand or a higher polydenate ligand, and the iridium compound is a phosphorescence luminescent organic metal complex containing a bidentate ligand or a higher polydenate ligand.

17. A passive-matrix drive display device using the organic electroluminescent element according to claim 1.

* * * * *